United States Patent [19]

Alderman et al.

[11] Patent Number: 4,849,992

[45] Date of Patent: Jul. 18, 1989

[54] PULSE-ON-PULSE CIRCUIT AND METHOD

[75] Inventors: Chester T. Alderman, Vienna; Erin A. McDowell, Alexandria; Edward R. Farren, Woodbridge, all of Va.

[73] Assignee: Aiken Advanced Systems, Inc., Alexandria, Va.

[21] Appl. No.: 818,249

[22] Filed: Jan. 13, 1986

[51] Int. Cl.[4] .......................... H03D 1/00; H03K 9/02
[52] U.S. Cl. ..................................... 375/94; 375/102; 455/305; 328/147; 329/109
[58] Field of Search .................... 375/94, 102, 104, 95; 342/200, 201, 14, 202; 455/304, 226, 305, 303; 328/147, 149; 307/356, 358; 358/36, 172, 153; 329/109; 381/33

[56] References Cited

U.S. PATENT DOCUMENTS

| | | | |
|---|---|---|---|
| 3,091,763 | 5/1963 | Mortley et al. | 342/202 |
| 3,870,996 | 3/1975 | Miller | 455/304 |
| 4,204,165 | 5/1980 | Ready | 455/226 |
| 4,311,963 | 1/1982 | Watanabe et al. | 455/304 |

OTHER PUBLICATIONS

Graf; *Modern Dictionary of Electronics;* Howard W. Sams and Co., Inc.; Indiana, U.S.A.; 1977; p. 143.

*Primary Examiner*—Benedict V. Safourek
*Assistant Examiner*—Andrew J. Telesz, Jr.
*Attorney, Agent, or Firm*—Cooper & Dunham

[57] ABSTRACT

Disclosed are a pulse cancellation system and a pulse cancellation method for enhancing the effect of a small pulse superimposed on a large pulse, in the context of processing video signals in a circuit employing a compression video amplifier. The original waveform is delayed by a selected interval which is short as compared with the expected duration of pulses of interest in it, and the delayed waveform is subtracted from the original one to cancel the effect of those portions of pulses which are longer than the selected delay interval. Excursions of the resulting waveform which are on a selected side of a selected baseline can be removed, if desired. Alternative embodiments provide for selectively bypassing the delay and cancellation circuits, to feed the detector output directly to the compression amplifier in some cases, and for placing the small pulse enhancing circuit before the detector.

17 Claims, 5 Drawing Sheets

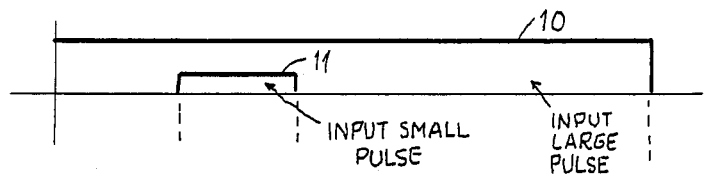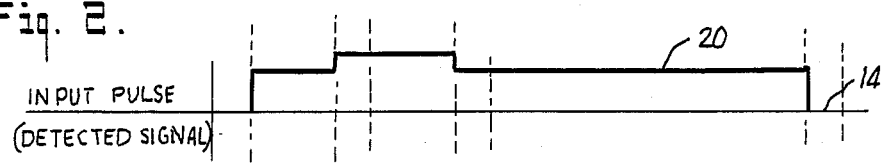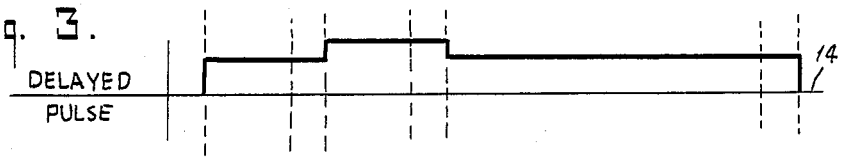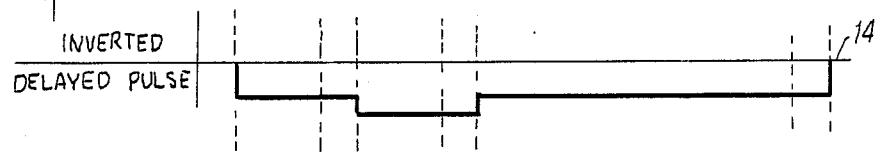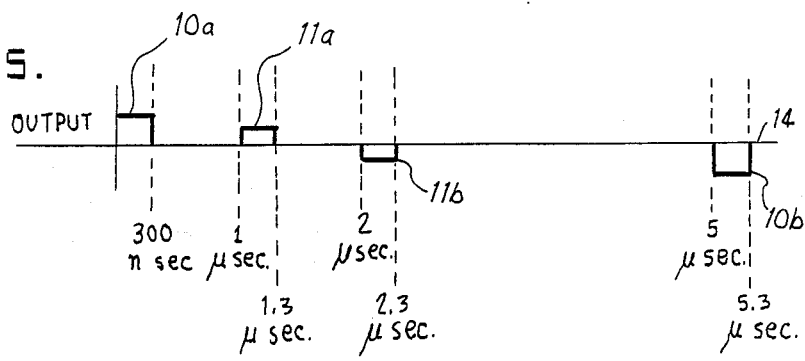

INPUT PULSE

LINEAR TRANSFER RESPONSE

OUTPUT
INPUT
COMPRESSIVE TRANSFER RESPONSE

OUTPUT PULSE RATIOS PRESERVED

OUTPUT PULSE RATIOS DISTORTED

PULSE-ON-PULSE CIRCUIT AND METHOD

BACKGROUND OF THE INVENTION

The invention is in the field of processing waveforms, particularly waveforms representing pulses such as may be detected by radar warning receivers, or electronic warfare countermeasures equipment.

In prior art systems, it is well known to use a Detector Log Video Amplifier (DLVA) to detect microwave signals varying in amplitude by up to 80 decibels. Generally the signals being detected are in the form of pulses. The DLVA is able to process signals of such a wide dynamic range because it has a logarithmic, or compressive, transfer response rather than a linear response. The gain of the amplifier in this case is dependent on input power level, and a signal of small amplitude will be amplified to a greater degree than a signal of large amplitude. One problem encountered in such prior art systems is that if a short pulse of small amplitude is incident on a longer pulse of large amplitude, the small pulse will be processed along with the large pulse, and therefore will be compressed to a greater degree than if the large pulse had not been present.

In prior art systems, important information can be obscured or lost when a signal from more than one source is being detected. The Compression Video Amplifier (CVA) processes the small pulse as if it were merely a perturbation on the larger pulse. Therefore, the small pulse is actually seen as a pulse of nearly equal magnitude to the larger pulse. In fact, previously it was often impossible to determine whether the small pulse even was a pulse, within the error limits of the CVA.

In particular, suppose that the CVA output is accurate to within $+/-0.5$ dB. Furthermore, suppose a pulse of magnitude $-10$ dBm is superimposed on a pulse of magnitude 0 dBm. The composite pulse would be 0.4 dBm. Accuracy within $+/-0.5$ dB at this level is equivalent to $+/-0.12$ milliwatts, which translates to over 3 dB when referenced back to the smaller pulse. Naturally, this error is compounded when pulses are considered which are further apart in dynamic range. However, when the original waveform is fed into a circuit embodying the present invention, pulse magnitude fidelity can be preserved.

Prior art systems are known which utilize an AC-Coupled DLVA in order to enhance a small pulse which is present on a CW signal (which might be considered an infinitely long, large pulse). However, it is believed that the present invention is the first system in which a small pulse can be accurately extracted from a larger pulse of finite length.

SUMMARY OF THE INVENTION

The present invention is able to detect a small pulse in the presence of a large pulse with great accuracy while still providing the increased dynamic range capabilities of a compressive amplifier. A specific aspect of the invention pertains to processing waveforms in the case of a signal originating from, say, a microwave source, so as to enhance the detection of a small pulse superimposed on a large pulse.

It will be appreciated that while the instant invention is directed primarily to processing signals originating from a microwave source operating at between 0.5 to 26 GHz, the invention is also useful in processing signals originating from other sources, and in using a detector such as a photodetector, a millimeter wave detector, or other detectors capable of detecting pulsed signals.

In accordance with one aspect of the invention, a circuit is provided which uses a compression amplifier in order to process waveforms over a wide dynamic range (for instance, one pulse at $-10$ dBm, and one at $-25$ dBm; one pulse at $+10$ dBm with another at $-40$ dBm; or both pulses at $+20$ dBm), but which comprises circuitry to effectively extract the small pulse from the larger pulse. In one exemplary embodiment, the circuit removes all but the initial effect of the large pulse from the composite waveform, so that the CVA can process the small pulse as referenced to the baseline rather than as superimposed on the large pulse (provided, of course, that the small pulse is present after the initial effect of the large pulse is over).

One embodiment of the invention involves summing a signal from a detector with a delayed and inverted signal from the same detector. The delay is chosen so as to be shorter than the expected time between the leading edge of pulses of interest. Other aspects of the invention will become apparent from the detailed description below.

BRIEF DESCRIPTION OF THE DRAWINGS

FIGS. 1-5 illustrate timing diagrams for a sample waveform of interest, where FIG. 1 shows a small pulse in the presence of a large pulse, FIG. 2 shows the composite pulse, made up of the large and small pulses, FIG. 3 shows the delayed composite pulse, FIG. 4 shows the inverted delayed composite pulse, and FIG. 5 shows the sum of the waveforms in FIG. 2 and FIG. 4.

DETAILED DESCRIPTION

Figure 6:
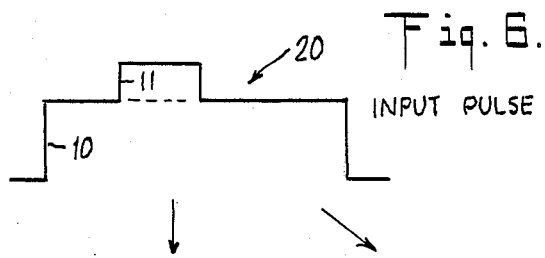
FIG. 6 illustrates the composite pulse, as detected by a detector.
Figure 7:
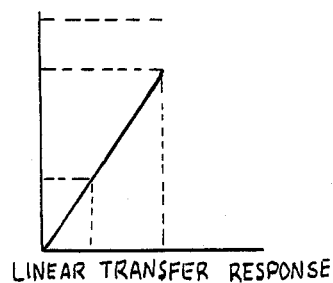
FIG. 7 illustrates a transfer response of a linear amplifier.
Figure 9:
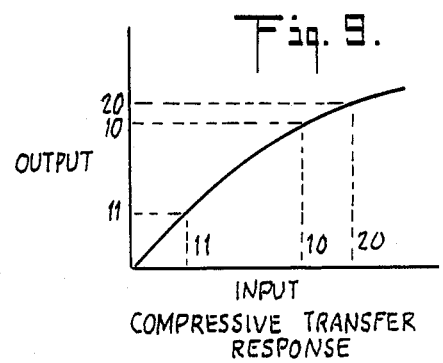
FIG. 9 illustrates a compressive transfer response (such as in a CVA).
Figure 8:
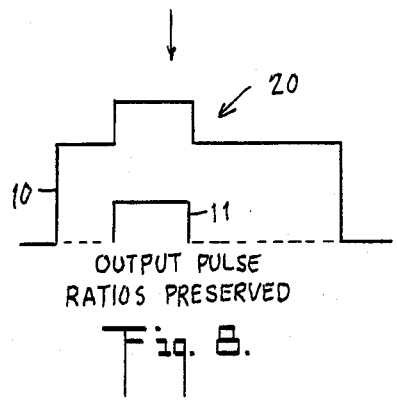
FIG. 8 illustrates the output of a circuit employing a transfer response such as shown in FIG. 7, given the input of FIG. 6.
Figure 10:
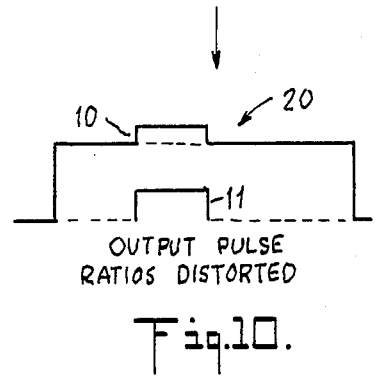
FIG. 10 illustrates the output of a circuit employing a transfer response such as shown in FIG. 9, given the input of FIG. 6.

The invention is designed to process waveforms, such as those present in radar warning receivers, which waveforms may include the detection of events corresponding to a large pulse such as pulse 10 illustrated in the time-amplitude diagram of FIG. 1, as well as a small pulse 11, also shown in FIG. 1. If the two events corresponding to pulses 10 and 11 are detected with the same detector, the detector output can be as illustrated in FIG. 2, where the small pulse 11 is superimposed on the large pulse 10 to form composite pulse 20. Referring to FIGS. 6–10, the waveform 20 illustrated in FIG. 6 corresponds to a pulse-on-pulse case such as depicted in FIG. 2. If that signal 20 is amplified through a linear amplifier, a transfer response of which is shown in FIG. 7, then pulse magnitude integrity is preserved by both the small pulse and the large pulse, and the output will simply be an amplification of the input pulse, as shown in FIG. 8. However, if the transfer response of the amplifier is compressive, or nonlinear, as is shown in FIG. 9, then the output will be dependent on input power level, and the small pulse which is riding on the larger pulse will appear to be compressed to a greater degree than the larger pulse, as shown in FIG. 10. On the one hand, it may be necessary to use a compression video amplifier to accommodate a wide dynamic range of input power levels, but on the other hand, it is of course undesirable to obscure small pulses of interest which happen to be superimposed on large pulses.

In accordance with one embodiment of the invention, a circuit and a method are provided which make it possible to enhance the effect at the CVA output of a small pulse superimposed on a large pulse in the detector output, while at the same time retaining the wide dynamic range benefits of the CVA.

In accordance with this embodiment of the invention, the detector output, which is a waveform that may include a small pulse 11 superimposed on a large pulse 10, is preamplified (if desired) and is delayed by a selected time interval, such as 300 nsec in this example, to produce a delayed waveform, for example as illustrated in FIG. 3. The delayed waveform of FIG. 3 is inverted to produce a sum waveform as illustrated in FIG. 5. The sum waveform of FIG. 5 includes a positive initial segment 10a of the large pulse and a positive initial segment 11a of the small pulse, and corresponding negative segments 11b and 10b. The negative segments can be cancelled, if desired, e.g., by means of a levelled clipping circuit.

A significant aspect of the sum waveform of FIG. 5 is that the positive segments 10a and 11a are both referenced to the same amplitude baseline 14. One important result of this is that when the small pulse 11a is fed into the CVA it will become compressed proportionately less than the large pulse 10a, which is the opposite of the result which would have been obtained had the detector output of FIG. 2 been fed directly to the CVA. However, it is identical to the result which would have been obtained if both pulses were processed independently.

Figure 11:
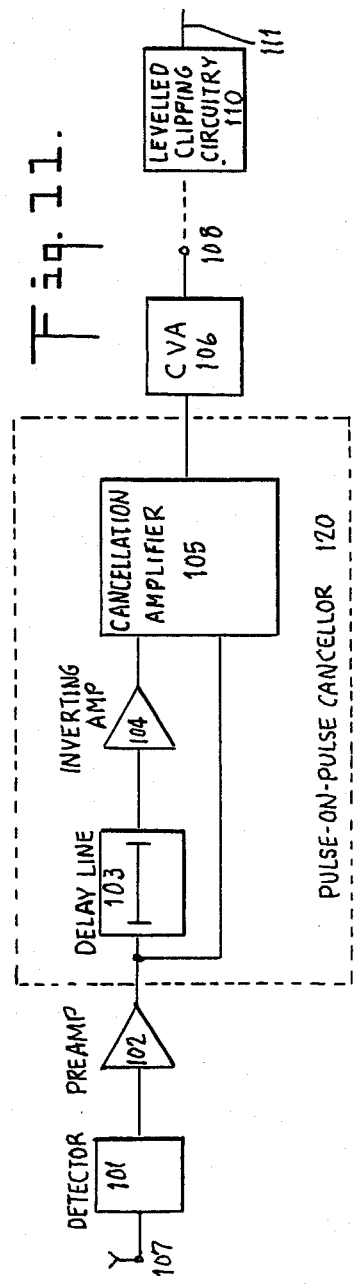
FIG. 11 illustrates an embodiment of a pulse-on-pulse circuit according to the invention.

Referring to FIG. 11, which illustrates an exemplary circuit embodying this aspect of the invention, a detector 101 detects a selected parameter, such as events which have time amplitude characteristics of the type illustrated in FIG. 1, and produces as a detector output a waveform which may include a small pulse superimposed on a large pulse, such as illustrated in FIG. 2. If there is a need for preamplification, the output of detector 101 can be preamplified at preamplifier 102. In order to produce a delayed waveform suitable for subtraction from the original waveform at the output of detector 101, the preamplified waveform from the output of preamplifier 102 is supplied to the input of a delay line 103, whose characteristics are selected to give the desired selected delayed time interval, e.g., 300 nsec.

Delay line 103 provides as an output a delayed waveform, such as that illustrated in FIG. 3. The output of delay line 103 is supplied to an inverting amplifier 104, which inverts it to produce a delayed inverted waveform from amplifier 104. The waveform from 104, and the preamplified waveform from preamplifier 102, are supplied to a cancellation amplifier 105 which sums them and provides as an output a sum waveform, e.g. as illustrated in FIG. 5. The sum waveform from the output of cancellation amplifier 105 is supplied to a compression video amplifier 106 (CVA) which compressively amplifies it to provide, at output terminal 108, a CVA output containing an enhanced effect of a pulse of one magnitude superimposed on a pulse of another (different or equal) magnitude in the output of detector 101.

If the pulses of interest are above a baseline 14, this leaves a resulting waveform in which the onset of a large pulse is above and referenced to the baseline, and remains so for the duration of the delay interval, or if it is shorter than the delay interval, until its end.

A small pulse which is superimposed on the large pulse in the original waveform also has an onset (in the resultant composite waveform) which is above and referenced to the same baseline, and remains so for the duration of the delay interval, or if it is shorter than the delay interval, until its end.

The resulting waveform in this embodiment will have excursions below the baseline, as seen in FIG. 5, where the "inverted" "delayed" signal is being "cleared out" of the circuit. These excursions below the baseline 14 can be removed, if not needed, for example with level clipping circuitry 110, seen in FIG. 11, to produce an output with no negative excursions at terminal 111. As an alternative, the clipping circuitry can be placed between cancellation amplifier 105 and CVA 106 rather than after the output of the CVA 106, as illustrated in FIG. 11.

Figure 12:
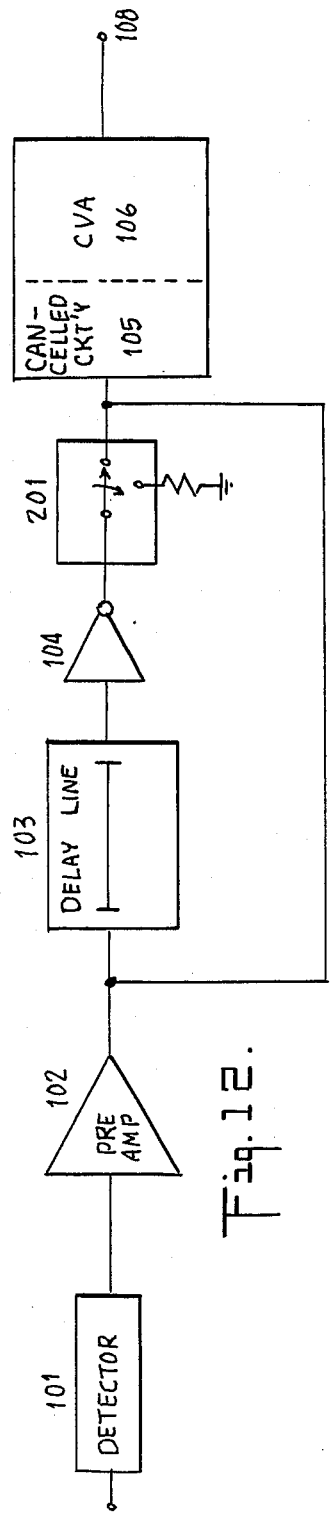
FIG. 12 illustrates another circuit according to the invention, which includes provisions for bypassing the pulse-on-pulse separation carried out by the circuit of FIG. 11.

There may be instances in which the pulse widths of the pulses incident on the CVA are of more interest than the small pulse amplitudes. In such cases, an alternative embodiment of the invention can be used, for example as illustrated in FIG. 12, in which means are provided to selectively bypass the pulse-on-pulse circuitry. Particularly, a switch 201 is provided in the delay line path. The switch is controllable either remotely or from control circuitry which may detect a preselected signal from the CVA, such as a selected amplitude or an amplitude range, or a pulse frequency, or both. Like elements of the circuits of FIGS. 11 and 12 bear like reference numerals. If desired, a clipping circuit can be provided in the system of FIG. 12, to serve the function of circuit 110 in FIG. 11.

Figure 13:
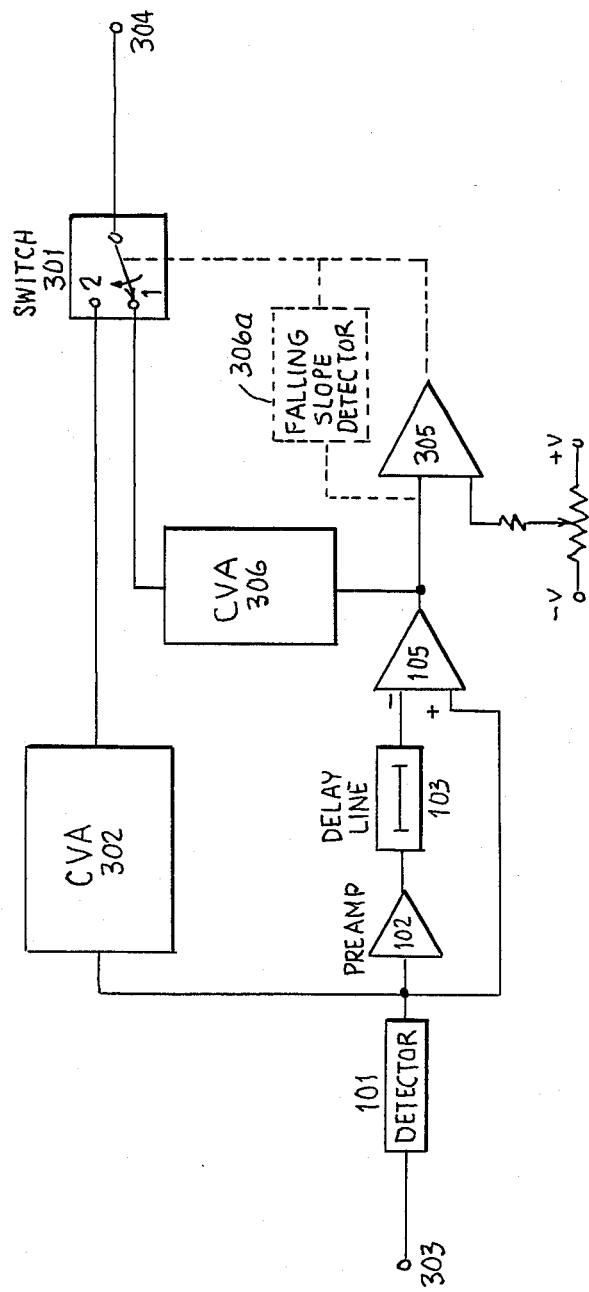
FIG. 13 illustrates a circuit selectively utilizing the invention in parallel with a prior art circuit to prevent "blind spots" while benefitting from the advantages of the invention.

As described previously, it can be desirable to use level clipping circuitry to remove negative pulse excursions. However, it may be that in the system in which the CVA is being used it is unacceptable to simply clip the negative portions of the output response, because pulse information may be present here. An example of this is a case where the fall of a small pulse coincides with the end of the delay time. In such a case, a blind area could develop. An embodiment which avoids such blind areas is depicted in FIG. 13. Components 101–103 and 105 comprise the cancellation portion described in connection with FIG. 11, and like elements bear like reference numerals. Comparator 305 is placed after the summing output of amplifier 105, and detects negative excursions, or excursions below or above a selected level (to allow for normal undershoot). While the signal is positive, the output will derive from the CVA 306. However, when a negative excursion is detected by the comparator, indicating that the large pulse has passed through the direct path and is in the process of "clearing out" of the delay path, the switch 301 is switched to position 2. In this position, a signal which has passed directly from the detector output and through a CVA 302 without pulse-on-pulse circuitry is used as the output. By using this embodiment, no valuable information is lost in the "shadow" of the large pulses. When the comparator no longer detects a negative signal, indicating that the delay has "cleared", switch 301 returns to position 1. The positions of switch 301 are suitably controlled by the output of comparator 305 to carry out the function described above.

It will be appreciated that instead of using the embodiment in FIG. 13, a system similar to that shown in FIG. 12 can be used in accordance with the invention, if switch 201 acts to open the path from the delay line. However, in this embodiment, there can still be a "blind spot" equivalent to the delay time of summing amplifier 304 and CVA 306.

As an alternative to using comparator 305 in the embodiment illustrated in FIG. 13, means 306a for detecting falling slope may be employed, which can also be used to indicate when the effects of the initial pulse are over. The means for detecting slope can be set to discriminate against gradual slopes, to thereby accomodate some drooping of the signal it receives from cancellation amplifier 105.

A final exemplary embodiment utilizes the "pulse-on-pulse" delay scheme in the signal path before the detector. It is known that a detector does not always display a consistent response over all input power levels. Therefore, a small pulse on a large pulse may be on a distorted section of the transfer response curve, whereas the small pulse alone is on a "typical" section. While this difference is generally very slight, it some cases it can be desirable to extract the small pulse from the large pulse before the detector in order to improve measuring accuracy. The embodiment depicted in FIG. 14 does this. The RF signal detected at antenna 410 is fed to an RF delay line 401. This may be a glass delay line, or another known RF delay. The delayed signal is then fed into a first phase locked loop PLL 403, which includes a voltage controlled oscillator VCO 404, and the PLL output is fed to the detector of DCVA 409. DCVA 409 comprises a detector similar to detector 101 and a CVA similar to CVA 106. The signal from antenna 410 is also fed into a second, parallel phase locked loop PLL 405, and the output of PLL 405 is fed into a phase shift circuit 408. The outputs of PLL 403 and phase shift circuit 408 are fed to a summing circuit 406. The purpose of the phase shift carried out by circuit 408 is to provide a signal to summing circuit 406 which is 180° out of phase from the signal fed to summing circuit 406 from VCO 404.

Figure 14:
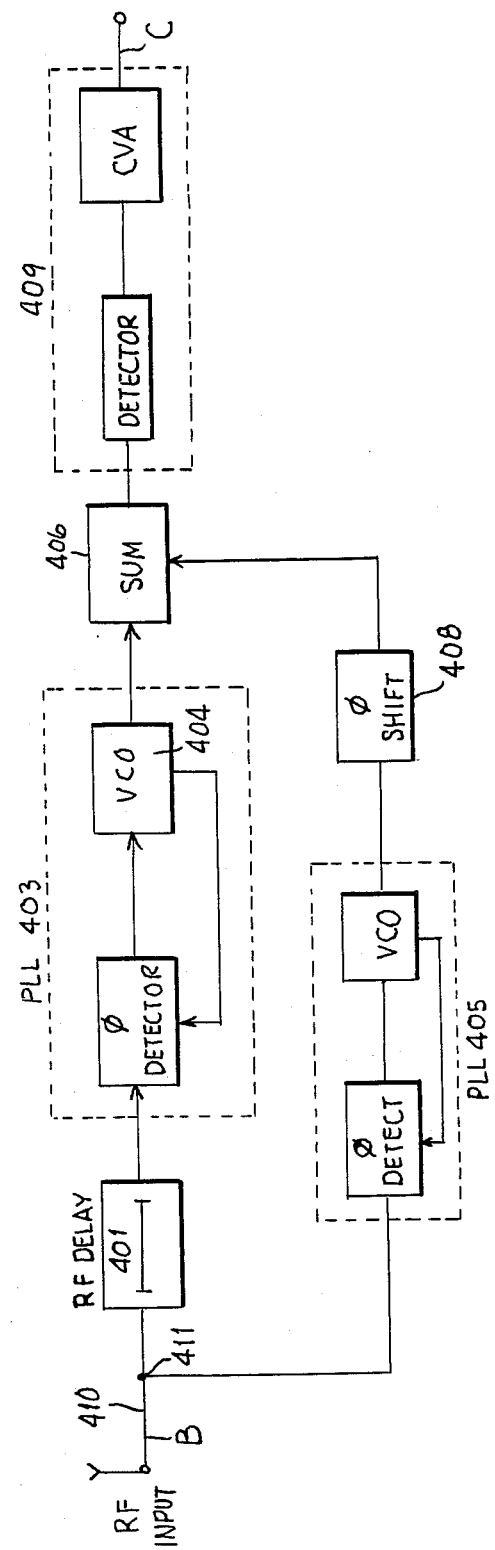
FIG. 14 illustrates a modified embodiment of the invention in which the pulse-on-pulse circuitry is prior to the detector.

Phase shift circuit 408 can be an adjustable phase shifter, adjusted so that inserting a CW (continuous wave) signal at point B will result in an output indicating baseline at point C. As an alternative, phase shift circuit 408 can be inserted in other locations, including in between the VCO 404 and summing circuit 406, or between junction 411 and RF delay 401, or between junction 411 and PLL 405. However, it is believed that the position shown in FIG. 14 is preferable.

We claim:
1. A system comprising:
a detector which detects a selected parameter and produces as a detector output a waveform including a small amplitude pulse superimposed on a large amplitude pulse;
a preamplifier which receives the detector output and produces as an output a preamplified waveform;
a delay line which receives and delays the preamplified waveform by a selected time interval to produce as an output a delayed waveform;
an inverter which receives and inverts the delayed waveform to produce as an output an inverted delayed waveform;
a cancellation amplifier which receives the inverted delayed waveform and the preamplified waveform, and produces as an output a sum waveform corresponding to the sum of the waveforms received thereby; and
a compressive amplifier which receives the sum waveform and amplifies the sum waveform received thereby non-linearly to provide a system output which facilitates detection of the small amplitude pulse.

2. A system as in claim 1 including means for selectively bypassing the delay line and the inerter, to selectively feed the preamplified waveform directly through the cancellation amplifier to the compressive amplifier.

3. A system as in claim 1 including a comparator which receives the output of the cancellation amplifier and compares the received output with a selected reference and produces a control signal responsive to the comparison, and means for selectively feeding one of the preamplifier output and the cancellation amplifier output to the compressive amplifier depending on said control signal.

4. A system for processing a waveform in which a pulse of small amplitude is superimposed on and thereby referenced to a pulse of large amplitude, comprising:
means for delaying a waveform by a selected delay interval which is short as compared with the expected duration of pulses of interest in the waveform;
means for subtracting the delayed waveform from the original waveform to cancel the effect of any pulse segment which extends in time beyond the selected delay interval, to thereby produce an output waveform in which at least a specified pulse width of the pulse of small amplitude is referenced to a baseline rather than to the pulse of large amplitude, and
means for removing excursions of the output waveform resulting from the subtractions which are on a selected side of said baseline.

5. A method comprising:
detecting a selected parameter and providing as a detector output a waveform including a small amplitude pulse superimposed on a large amplitude pulse;
preamplifying the detector output to provide a preamplified waveform;
delaying the preamplified waveform by a selected time interval to produce a delayed waveform;
inverting the delayed waveform to produce an inverted delayed waveform;
summing the inverted delayed waveform and the preamplified waveform to provide a sum waveform; and
amplifying the sum waveform by means of a compressive amplifier to provide a system output which facilitates detection of the small amplitude pulse.

6. A method as in claim 5 including the step of selectively bypassing the delaying and inverting steps, to selectively feed the preamplified waveform directly to the compressive amplifier.

7. A method as in claim 5 including the step of comparing the sum waveform with a selected reference to produce a control signal responsive to said comparison, and selectively feeding one of the detector output and the sum waveform to said compressive amplifier depending on said control signal.

8. A method as in claim 5 including the step of detecting the slope of the sum waveform to produce a control signal responsive to said slope, and selectively feeding one of the detector output and the sum waveform to said compressive amplifier depending on said control signal.

9. A method of processing a waveform in which a pulse of small amplitude is superimposed on and thereby referenced to a pulse of large amplitude, comprising:
    delaying an original waveform by a selected delay interval which is short as compared with the expected duration of pulses of interest in the original waveform, to thereby produce a delayed waveform;
    subtracting the delayed waveform from the original waveform to cancel those portions of pulses in the original waveform which extend beyond the respective pulse onsets by more than the selected delay interval and are on a selected side of a baseline; and
    removing excursions of the waveform resulting from the subtractions which are on the side of the baseline opposite said selected side, to thereby facilitate detection of said small amplitude pulse.

10. A system comprising:
    a detector which detects a signal and generates from said detected signal a real time signal including a small amplitude pulse superimposed on a large amplitude pulse;
    a delay means which delays the real time signal and produces a delayed signal;
    a cancellation means which subtracts the delayed signal from the real time signal and produces as a result an output signal;
    a compression amplifier which has a nonlinear transfer function and receives the output signal and provides a system output which facilitates detection of a small amplitude pulse superimposed on a large amplitude pulse in said real time signal.

11. A system as in claim 10 in which the cancellation means comprises a differential amplifier.

12. A system as in claim 10 in which the cancellation means comprises an inverting amplifier which receives the delayed signal and inverts the received waveform to provide an inverted delayed signal and a summing amplifier which receives the delayed inverted signal and the real time signal and provides their sum as said output signal.

13. A system as in claim 10 in which the compression amplifier is a logarithmic amplifier.

14. A system as in claim 10 in which the detector comprises a microwave detector, the cancellation means comprises a differential amplifier, the compression amplifier comprises a logarithmic amplifier, and including means which receives the system output and removes excursions thereof which are on a selected side of a selected baseline.

15. A system as in claim 10 including means which receives the system output and removes excursions thereof which are on a selected side of a selected baseline.

16. A system comprising:
    an RF antenna which receives a waveform including a small pulse superimposed on a large pulse and produces an antenna output waveform;
    an RF delay which receives and delays the antenna output waveform by a selected time interval to produce as an output a delayed RF waveform;
    a first phase locked loop which receives the delayed RF waveform and produces a first phase locked output;
    a second phase locked loop which receives the antenna output waveform and produces a second phase locked output;
    a phase shift circuit which receives the second phase locked output and shifts said second phase locked output to substantially 180° out of phase with respect to the first phase locked output to thereby produce a phase-shifted second phase locked output;
    means for summing the first phase locked output and the phase-shifted second phase locked output and for providing a sum output; and
    a detector which receives the sum output and detects a selected parameter of the received sum output and produces a detector output, and a compressive amplifier which receives the detector output and produces a system output.

17. A system comprising:
    an RF antenna which receives a waveform including a small pulse superimposed on a large pulse and produces an antenna output;
    first means for receiving and processing the antenna output to produce a first RF output which is delayed by a selected interval with respect to the antenna output;
    second means for receiving and processing the antenna output to produce a second RF output which is phase-shifted by a selected angle with respect to the first RF output;
    means for summing the first RF output and the second RF output and for providing a sum output; and
    a detector which receives the sum output and detects a selected parameter of the received sum output and produces a detector output, and a compressive amplifier which receives the detector output and produces a system output.

* * * * *